(12) United States Patent
Morishita

(10) Patent No.: US 6,445,040 B1
(45) Date of Patent: Sep. 3, 2002

(54) LATERAL BIPOLAR TYPE INPUT/OUTPUT PROTECTION DEVICE

(75) Inventor: Yasuyuki Morishita, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/499,942

(22) Filed: Feb. 8, 2000

(30) Foreign Application Priority Data

Feb. 10, 1999 (JP) ............................................. 11-033251

(51) Int. Cl.[7] ........................ H01L 23/62; H01L 27/095; H01L 27/082
(52) U.S. Cl. ........................ 257/355; 257/355; 257/361; 257/362; 257/578; 257/591
(58) Field of Search ................................ 257/355, 361, 257/362, 578, 591, 592, 557, 558, 500, 501, 511, 517, 552, 499

(56) References Cited

U.S. PATENT DOCUMENTS

| 4,038,680 A | * | 7/1977 | Yagi et al. | ................... | 257/555 |
| 4,760,433 A | * | 7/1988 | Young et al. | ................. | 257/357 |
| 5,945,726 A | * | 8/1999 | Prall et al. | ................... | 257/565 |
| 6,051,458 A | * | 4/2000 | Liang et al. | ................. | 438/224 |

FOREIGN PATENT DOCUMENTS

| JP | 62224057 | | 10/1987 | | |
| JP | 63278267 | | 11/1988 | | |
| JP | 403159246 A | * | 11/1989 | | |
| JP | 3272180 | | 12/1991 | | |
| JP | 405190564 A | * | 7/1993 | | |
| JP | 7122715 | | 5/1995 | | |
| JP | 851188 | | 2/1996 | | |
| JP | 8-111508 | | 4/1996 | ........... | H01L/27/06 |
| JP | 9-36357 | | 2/1997 | ........... | H01L/29/78 |
| JP | 10-261764 | | 9/1998 | ........... | H01L/27/04 |
| JP | 2000-200694 | | 7/2000 | ........... | H05F/3/02 |

* cited by examiner

Primary Examiner—Jerome Jackson, Jr.
Assistant Examiner—Joseph Nguyen
(74) Attorney, Agent, or Firm—Hayes Soloway P.C.

(57) ABSTRACT

A lateral bipolar type input/output protection device of the present invention includes a N type well formed below an emitter impurity diffusion layer of N type over a P type substrate. With such construction of the lateral bipolar type input/output protection device, a parasitic bipolar operation occurs easily and sufficient electrostatic durability without degradation of protection performance of the protection device even when a semiconductor integrated circuit is miniaturized by employing the STI isolation structure.

13 Claims, 3 Drawing Sheets

LATERAL BIPOLAR TYPE INPUT/OUTPUT PROTECTION DEVICE

BACKGROUND OF THE INVENTION

1. Field of the Invention

The present invention relates to a semiconductor device and, particularly, to a lateral bipolar type input/output protection device to be used for a semiconductor integrated circuit.

2. Description of the Related Art

A conventional lateral bipolar type input/output protection device is formed by the structure which includes a field oxide formed in a well region formed on a semiconductor substrate of the same conductivity type with the well region such as field isolation structure disclosed in Japanese Patent Application Laid-open Nos. H8-51188 and H7-122715. FIG. 3 is a cross section of a conventional lateral bipolar type input/output protection device. As shown in FIG. 3, an N type collector diffusion layer 12, an N type emitter diffusion layer 13 and a P type diffusion layer 14 for grounding a substrate are formed on a P type well 17 of the P type substrate 19 and the respective layers 12, 13, and 14 are isolated from each other by a field oxide film 16 formed by the Local Oxidation of Silicon (LOCOS). In this structure, when a negative high voltage pulse is applied to an input/output terminal 11 due to electrostatic discharge (ESD), etc., a PN junction between the N type collector diffusion layer 12 and the P type well 17 is forward-biased, so that over-current flows from the input/output terminal 11 through the P type diffusion layer 14 to a ground terminal 15, by the forward diode formed by the PN junction. When a positive high voltage pulse is applied to an input/output terminal 11 due to ESD, etc., the PN junction between the N type collector diffusion layer 12 and the P type well 17 is reverse-biased, and, when the applied voltage exceeds a breakdown voltage of the junction, avalanche breakdown current as well as a substrate current due to impact ionization in an end portion of the junction flow to the P type well 17. With the avalanche breakdown current and the substrate current flowing to the P type well 17, a potential of the P type well 17 rises with respect to the ground terminal 15, due to an influence of a parasitic resistance component of the P type well 17. When the potential of the P type well 17 rises and the PN junction between the P type well 17 and the N type emitter diffusion layer 13 becomes forward-biased, a lateral NPN bipolar transistor turns ON and a voltage between the input/output terminal 11 and the ground terminal 15 is clamped at a low value. As mentioned, when the positive high voltage pulse is applied to the input/output terminal 11 due to ESD, etc., the lateral NPN bipolar transistor turns ON to release the over-current to the ground terminal 15.

Conventional input/output protection devices themselves are also disclosed in Japanese Patent Application Laid-open Nos. S62-224057, S63-278267 and H3-272180.

In a recent semiconductor integrated circuit, in order to increase the integration density, a shallow trench isolation (STI) structure is becoming popular as the field isolation structure in lieu of the LOCOS structure. In the STI structure, however, it is necessary, in order to keep a fine isolation, to provide an isolation oxide film deeper compared with that of the LOCOS structure. If such STI structure, in which a field oxide film is formed deeper, were applied to the conventional lateral bipolar type input/output protection device, a base width should be increased during a bipolar operation thereof and current amplification is lowered, so that the bipolar operation hardly occurs. Therefore, the STI structure can not be applied to the conventional lateral bipolar type input/output protection device since the ESD protection performance is degraded.

SUMMARY OF THE INVENTION

An object of the present invention is to provide a lateral bipolar type input/output protection device whose protection performance is not degraded even when a deep field isolation structure such as the STI structure is applied.

A lateral bipolar type input/output protection device according to the present invention has a well formed below an emitter impurity diffusion layer and having the same conductivity type as that of the emitter impurity diffusion layer. Therefore, it is possible to easily perform a bipolar operation and to prevent protection performance from being degraded. As a result, it is obtained sufficient ESD robustness even when the size of the semiconductor integrated circuit is smaller by using the field isolation structure such as STI structure.

BRIEF DESCRIPTION OF THE DRAWINGS

This above mentioned and other objects, features and advantages of the present invention will become more apparent by reference to the following detailed description of the invention taken in conjunction with the accompanying drawings, in which.

DETAILED DESCRIPTION OF THE PREFERRED EMBODIMENTS

Figure 1A:
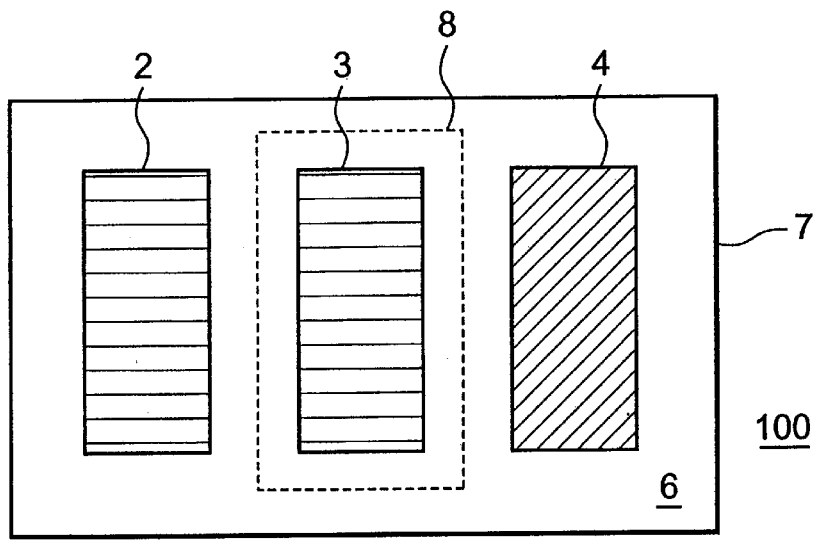
FIGS. 1A, 1B and 1C show an input/output protection device of a semiconductor integrated circuit according to a first embodiment of the present invention.
Figure 1B:
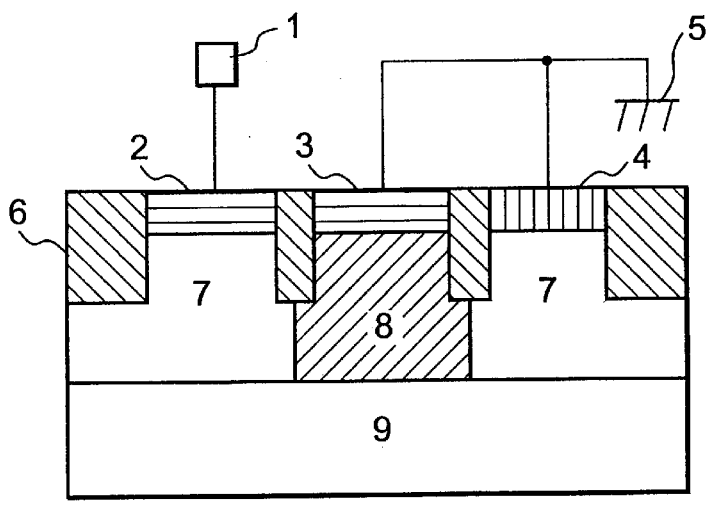
Figure 1C:
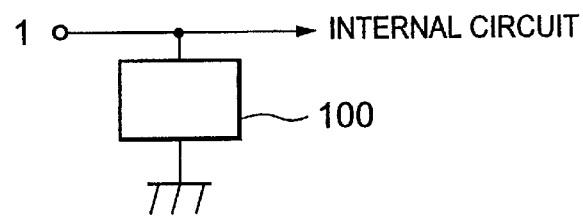

FIG. 1A is a plan view of the input/output protection device of a semiconductor integrated circuit, according to a first embodiment of the present invention. FIG. 1B is a cross section showing an input/output protection device in FIG. 1A. FIG. 1C shows a relationship between the input/output protection device shown in FIGS. 1A and 1B and an internal circuit.

As shown in FIGS. 1A and 1B, the input/output protection device according to the first embodiment of the present invention has a structure constructed with an N type collector diffusion layer 2 connected to an input/output terminal 1, an N type emitter diffusion layer 3 connected to a ground terminal 5, a P type diffusion layer 4 connected to the ground terminal 5, an N type well 8 formed below the N type emitter diffusion layer 3, a P type well 7 corresponding to a base region of a bipolar transistor and a P type substrate 9. Each of The N type collector diffusion layer 2, the N type emitter diffusion layer 3, and the P type diffusion layer 4 is surrounded by the STI structure as shown in FIG. 1A. The N type emitter diffusion layer 3 has an impurity concentration which is higher than that of the N type well 8. The STI structure of the input/output protection device of the present invention is formed while an STI structure of an internal circuit, which is formed in the same substrate with the input/output protection device, is formed.

Now, an operation of this embodiment will be described. When a positive high voltage pulse is applied to the input/ output terminal 1 due to ESD, etc., a PN junction between the N type collector diffusion layer 2 and the P type well 7 is avalanche-broken down and a breakdown current flows from the input/output terminal 1 through the P type well 7, the P type substrate 9, the P type well 7 and P type diffusion layer 4 to the ground terminal 5. When the current flows to the P type well 7 and the P type substrate 9, potentials of the P type well 7 and the P type substrate 9 rise with respect to the ground terminal 5, due to an influence of parasitic resistance components of the P type well 7 and the P type substrate 9. With the provision of the N type well 8 below the N type emitter diffusion layer 3, it is possible to reduce a base width, so that the bipolar operation can be easily occurred. When the potentials of the P type well 7 and the P type substrate 9 rise and a PN junction between the P type well 7 and the N type well 8 or between the P type substrate 9 and the N type well 8 is forward-biased, the NPN bipolar transistor starts to turn-on.

When a negative high voltage pulse is applied to the input/output terminal 1 due to ESD, etc., the PN junction between the N type collector diffusion layer 2 and the P type well 7 is forward-biased, so that over-current is released by a forward diode from the input/output terminal 1 through the P type diffusion layer 4 to the ground terminal 5.

The first embodiment mentioned above can be fabricated in the following manner.

An thermal oxidation is performed on the surface of a P type silicon substrate 9 to form a thermal oxide film (not shown) on the substrate 9. Then, a STI formation region is etched to form grooves in the substrate 9 with a depth of about 0.5 $\mu$m. Then, an oxide film is deposited over the substrate including groove by the chemical vapor deposition (CVD) method. Then, a chemical mechanical polishing (CMP) is performed over the substrate 9 to form STI structures 6. After STI structures 6 are formed in the P type silicon substrate 9 up to a depth of about 0.5 $\mu$m, the P type well 7 and the N type well 8 having impurity concentration of about $1 \times 10^{13}$ atoms/cm$^2$ are formed by ion implantation and annealing. Thereafter, the N type collector diffusion layer 2 and the N type emitter diffusion layer 3 are formed by arsenic ion implantation with a dose amount of $5 \times 10^{15}$ atoms/cm$^2$ and annealing and the P type diffusion layer 4 for substrate potential is formed by boron ion implantation with a dose amount of $3 \times 10^{15}$ atoms/cm$^2$ and annealing. In this case, the width of the N type well 8 (interval of the P type well 7) was about 2 $\mu$m. Since the N type well 8 is formed simultaneously with a formation of an N type well of a p-MOS transistor in the semiconductor integrated circuit, the number of fabrication steps is not increased.

FIG. 1c shows a method for using the input/output protection device of the present invention shown in FIGS. 1A and 1B. The input/output terminal shown in FIG. 1B is connected to an internal circuit formed on the substrate 9 through the N type collector diffusion layer 2.

Figure 2A:
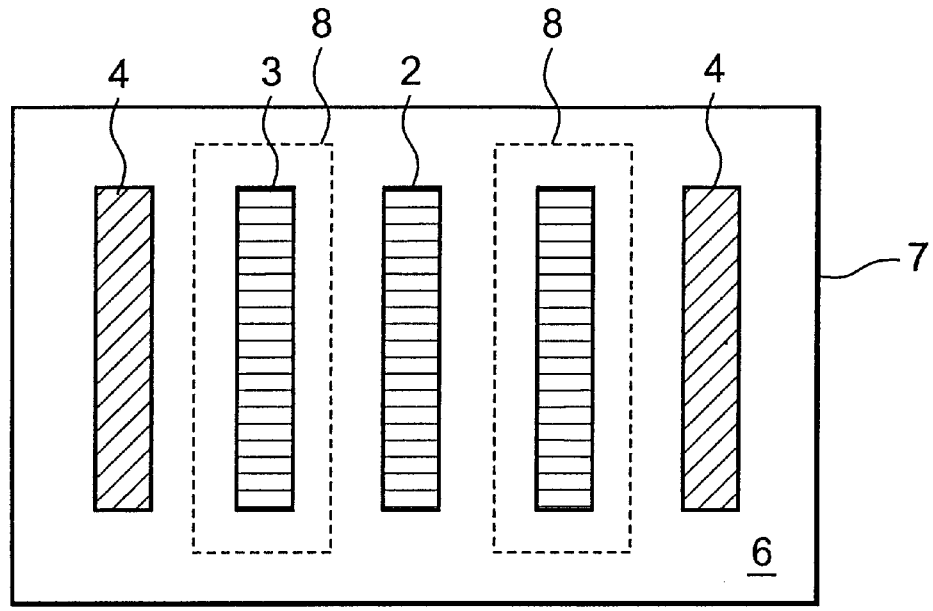
FIGS. 2A and 2B show an input/output protection device of a semiconductor integrated circuit according to a second embodiment of the present invention.
Figure 2B:
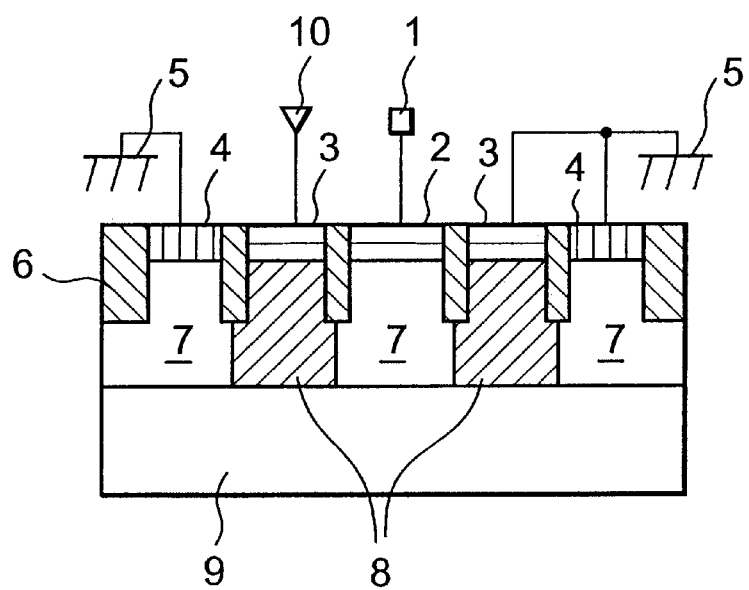
Figure 3:
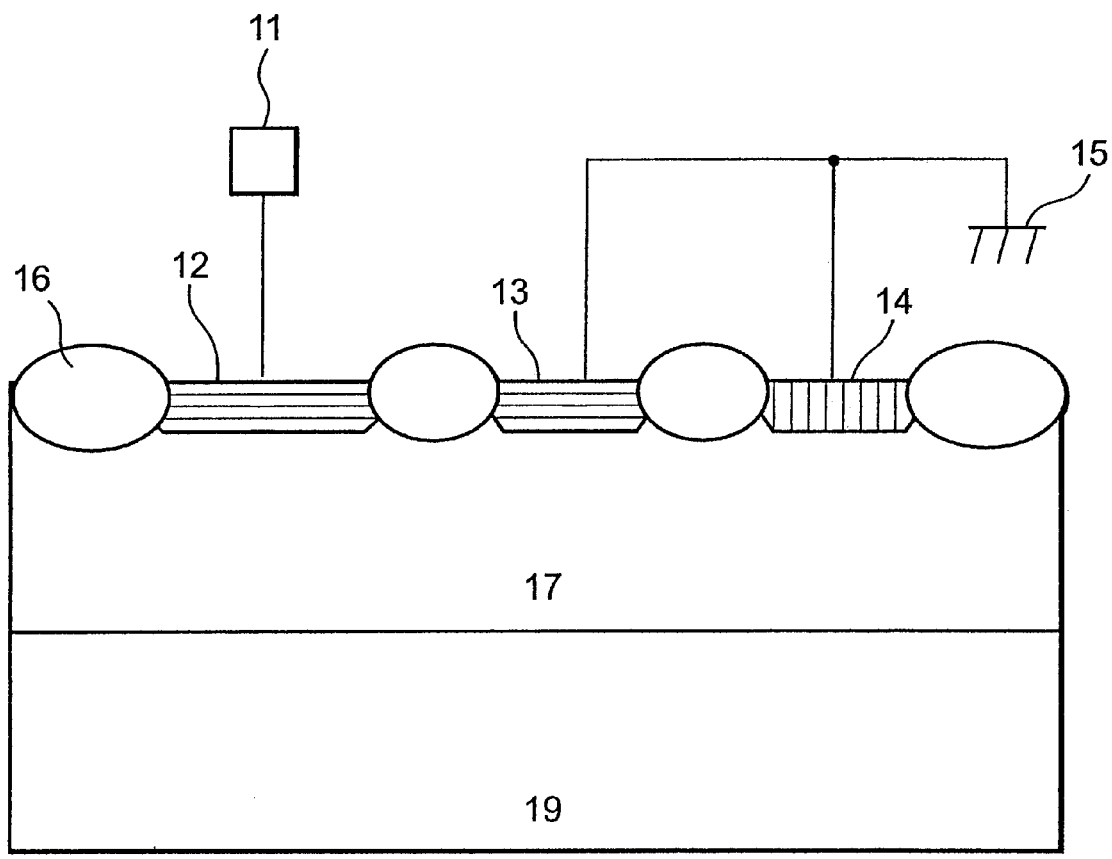
FIG. 3 is a cross sectional view showing a conventional input/output protection device of a semiconductor integrated circuit.

FIGS. 2A and 2B illustrate an input/output protection device of a semiconductor integrated circuit according to a second embodiment of the present invention. FIG. 2A is a plan view of the input/output protection device of a second embodiment of the present invention and FIG. 2B is a cross section view of an input/output protection device shown in FIG. 2A. The second embodiment has a structure constructed with an N type collector diffusion layer 2 connected to an input/output terminal 1, N type emitter diffusion layers 3 connected to a ground terminal 5 and to a power source terminal 10, respectively, a P type diffusion layer 4 connected to the ground terminal 5, N type wells 8 formed below the respective N type emitter diffusion layers 3, P type wells 7 corresponding to a base region of a bipolar transistor and a P type substrate 9. That is, in the second embodiment of the present invention, the N type emitter diffusion layer 3 for connection to the power source terminal 10 is formed additionally. With this construction, it is possible to by-pass over-current to the ground terminal 5 as well as to the power source terminal 10, so that the protective performance on ESD, etc., can be further improved.

When an STI structure having a depth of 0.5 $\mu$m is employed as a field isolation structure of a semiconductor integrated circuit, a conventional lateral bipolar type input/output protection device can provide an ESD tolerance voltage of only 500 V or lower in the Human Body Model (HBM) ESD application test. However, by applying the STI structure according to the first embodiment of the present invention to a semiconductor integrated circuit, an ESD tolerance voltage of 2000 V or higher could be obtained in the HBM-ESD application test and the integration density of the whole semiconductor integrated circuit became about twice.

Although, in the described embodiment, the STI structure is employed as the field isolation structure, the present invention can be applied to other isolation structure with which the bipolar operation becomes difficult when the thickness of the isolating insulating film is increased. Further, in the first embodiment, the ground terminal may be a power source terminal.

As described hereinbefore, according to the present invention, it is possible to construct the input/output protection device without degradation of the protective performance even when, in order to miniaturize a semiconductor integrated circuit, a STI structure, etc., having a thick insulating film for isolating semiconductor elements is employed as a field isolation structure.

Although the present invention has been described with reference to specific embodiments, this description is not meant to be construed in a limiting sense. Various modifications of the disclosed embodiments will become apparent to persons skilled in the art upon reference to the description of the invention. It is, therefore, contemplated that the appended claims will cover any modifications or embodiments as fall within the true scope of the present invention.

What is claimed is:

1. A semiconductor device comprising:
   a semiconductor substrate of a first conductivity type;
   a first well of said first conductivity type formed on said semiconductor substrate;
   a second well of said first conductivity type formed on said semiconductor substrate;
   a third well of a second conductivity type formed on said semiconductor substrate between said first and second wells;
   a first diffusion layer of said first conductivity type formed on said first well;
   a second diffusion layer of said second conductivity type formed on said second well;
   a third diffusion layer of said second conductivity type formed on said third well; and
   an isolation region formed over said semiconductor substrate to isolate said first, second and third diffusion layers from each other.

2. The device as claimed in claim 1, said device further comprising:
   a signal terminal coupled to said second diffusion layer; and a power source terminal connected to said first and third diffusion layers.

3. The device as claimed in claim 2, wherein said first conductivity type is a P type and said second conductivity type is a N type.

4. The device as claimed in claim 3, wherein said isolation region has a substantial rectangular shape in cross section.

5. The device as claimed in claim 4, wherein said isolation region is a shallow trench isolation structure.

6. The device as claimed in claim 5, wherein said isolation region is formed by performing an thermal oxidation on the surface of said semiconductor substrate to form a thermal oxide film on said semiconductor substrate; removing the surface of said semiconductor substrate including said thermal oxide film to form grooves in said semiconductor substrate; depositing an oxide film over said semiconductor substrate including groove; performing a chemical mechanical polishing over said semiconductor substrate to form said shallow trench isolation structure.

7. The device as claimed in claim 6, wherein each of said first to third diffusion layers is surrounded by said shallow trench isolation structure.

8. The device as claimed in claim 5, wherein said second diffusion layer has an impurity concentration which is higher than that of said second well.

9. The device as claimed in claim 1, said device further comprising:
a fourth well of said first conductivity type formed on said semiconductor substrate;
a fifth well of said second conductivity type formed on said semiconductor substrate between said second and fourth wells;
a fourth diffusion layer of said first conductivity type formed on said fourth well; and
a fifth diffusion layer of said second conductivity type formed on said fifth diffusion layer between said second and fourth diffusion layers;
wherein said isolation region is formed over said semiconductor substrate to isolate said second, fourth, and fifth diffusion layers from each other.

10. The device as claimed in claim 9, said device further comprising:
a signal terminal connected to said second diffusion layer;
a first power source terminal coupled to said first, third and fourth diffusion layers; and
a second power source terminal connected to said fifth diffusion layer.

11. The device as claimed in claim 10, wherein said first conductivity type is a P type and said second conductivity type is a N type.

12. The device as claimed in claim 11, wherein said isolation region is a shallow trench isolation structure.

13. A semiconductor device including a lateral bipolar type input/output protection device, said lateral bipolar type input/output protection device comprising:
an emitter impurity diffusion layer of a first conductivity type;
a well of said first conductivity type formed below said first emitter impurity diffusion layer; and
an input/output terminal and an internal circuit connected to said input/output terminal to perform at least one of a first operation of receiving a signal from said input/output terminal and a second operation of transferring a signal to said input/output terminal, said lateral bipolar type input/output protection device being connected to said input/output terminal to protect said internal circuit from an electrostatic discharge.

* * * * *